(12) United States Patent
Schunk

(10) Patent No.: US 7,217,043 B2
(45) Date of Patent: May 15, 2007

(54) OPTOELECTRONIC TRANSCEIVER

(75) Inventor: Nikolaus Schunk, Maxhutte-Haidhof (DE)

(73) Assignee: Infineon Technologies Fiber Optics GmbH, Berlin (DE)

( * ) Notice: Subject to any disclaimer, the term of this patent is extended or adjusted under 35 U.S.C. 154(b) by 0 days.

(21) Appl. No.: 11/133,782

(22) Filed: May 20, 2005

(65) Prior Publication Data

US 2006/0072881 A1 Apr. 6, 2006

Related U.S. Application Data

(60) Provisional application No. 60/616,290, filed on Oct. 6, 2004.

(51) Int. Cl.
*G02B 6/43* (2006.01)
*H04B 10/00* (2006.01)

(52) U.S. Cl. .......................... 385/94; 385/92; 398/139

(58) Field of Classification Search ...................... None
See application file for complete search history.

(56) References Cited

U.S. PATENT DOCUMENTS

| 5,493,437 | A  | * | 2/1996 | Lebby et al. | ................ | 398/139 |
| 6,950,314 | B2 | * | 9/2005 | Reznik et al. | ............. | 361/764 |
| 2002/0132524 | A1 |  | 9/2002 | Festag et al. | | |
| 2005/0084268 | A1 | * | 4/2005 | Weigert | ....................... | 398/135 |
| 2005/0249450 | A1 | * | 11/2005 | Schrodinger | ................. | 385/14 |

FOREIGN PATENT DOCUMENTS

DE 101 14 143 C2 10/2002

* cited by examiner

*Primary Examiner*—Michelle Connelly-Cushwa
*Assistant Examiner*—Jerry T. Rahll
(74) *Attorney, Agent, or Firm*—Eschweiler & Associates, LLC

(57) ABSTRACT

An opto-electronic transceiver having: a transmitting component for converting electrical signals into optical signals; a first circuitry module for the transmitting component; a receiving component for converting optical signals into electrical signals; a second circuitry module for the receiving component; a printed circuitboard with conductor tracks, on which the transmitting component, the receiving component, the first circuitry module and the second circuitry module are arranged; and a transceiver housing including a nonconductive material and has a connector receptacle for receiving and coupling an optical connector. The transmitting component, the first circuitry module, the receiving component and the second circuitry module form at least one subassembly, the subassembly having: an encapsulation composition, in which the components of the subassembly are embedded, and a wiring layer embodied using thin-film technology, the wiring layer providing an electrical contact connection between the subassembly components and to associated contacts of the printed circuit board.

26 Claims, 11 Drawing Sheets

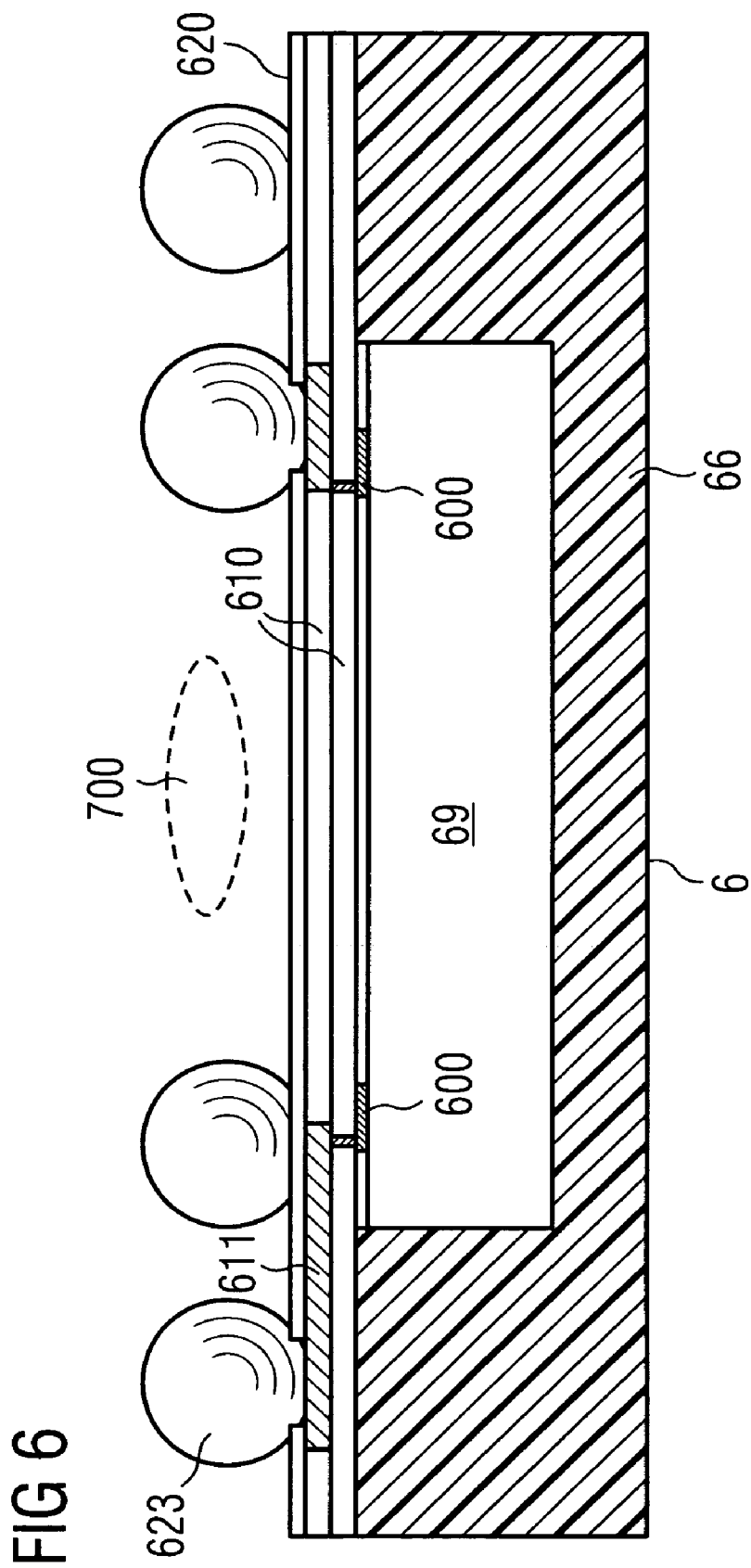

OPTOELECTRONIC TRANSCEIVER

RELATED APPLICATION

The present application claims priority of U.S. patent application Ser. No. 60/616,290 filed by Nikolaus Schunk on Oct. 6, 2004.

FIELD OF THE INVENTION

The invention relates to an optoelectronic transceiver. In particular, the invention relates to a compact opto-electronic transceiver in which the distance between the optical axes of transmitting component and receiving component of the transceiver is considerably reduced and, in particular, is 750 μm, so that a direct butt coupling to an MT-RJ connector is possible.

BACKGROUND OF THE INVENTION

So-called small form factor (SFF) and small form factor pluggable (SFP) transceivers of small design are known which can be arranged in pluggable fashion on a host printed circuitboard. In addition to an optoelectronic transmitting module and an optoelectronic receiving module, the known transceivers have an internal module printed circuitboard arranged in a manner oriented parallel to the host printed circuitboard in the transceiver. Integrated circuits such as a driver module and/or a preamplifier module are arranged on the internal module printed circuitboard. Optical waveguides can be optically coupled to the transducers via an optical port of the SFP transceiver. Such an SFP transceiver is described in DE 101 14 143 A1 for example.

Optical connectors provide releasable connections of optical waveguides in an optical communication system. They serve for example for optical connection of an optical waveguide to a transmitter and/or a receiver of an optoelectronic transceiver.

A connector family having particularly inexpensive and compact optical connectors is the MT-RJ connector family corresponding to the IEC 61754-18 standard. The MT-RJ connector family is specified both for single fiber and for parallel fiber (duplex) connections. In a connector housing with an RJ-45 mechanism, a duplex MTRJ connector has two glass fibers arranged at a distance of 750 μm. Two guide holes or two guide pins are provided laterally with respect to the glass fibers.

In order to couple an MT-RJ connector to known transceivers, it is necessary to perform a deflection by means of two 90° deflection mirrors for each optical axis, which mirrors transform a larger distance between the optical axes of transmitter and receiver of the transceiver to the small 750 μm distance of an MT-RJ connector.

There is a need for optoelectronic transceivers whose size is reduced further and in which, in particular, the distance between the axes of transmitter and receiver is small enough to enable a direct butt coupling to the glass fibers of an MT-RJ connector. At the same time, the intention is to ensure that, despite the small distance between transmitter and receiver, an electrical crosstalk between these components is largely avoided even at high frequencies in the Gbps range.

SUMMARY OF THE INVENTION

The invention provides an optoelectronic transceiver having: a transmitting component, which converts electrical signals into optical signals, a first circuitry module for the transmitting component, a receiving component, which converts optical signals into electrical signals, a second circuitry module for the receiving component, a printed circuitboard with conductor tracks, on which the transmitting component, the receiving component, the first circuitry module and the second circuitry module are arranged, and a transceiver housing, which comprises a non-conductive material and has a connector receptacle for receiving and coupling an optical connector. In this case, the transmitting component, the first circuitry module, the receiving component and the second circuitry module form at least one subassembly which has an encapsulation composition, in which the components of the subassembly are embedded, and a wiring layer embodied using thin-film technology, said wiring layer providing an electrical contact connection on the one hand between the components of the subassembly among one another and on the other hand to associated contacts of the printed circuitboard.

The solution according to the invention permits a closely adjacent arrangement of transmitting component and receiving component at a distance of 750 μm, for example. At the same time, an electrical near-end crosstalk is largely prevented by the provision of a wiring layer with lithographic wiring embodied using thin-film technology. Thus, in contrast to what is customary in the prior art, the electrical contact-connection of transmitting component and receiving component is not effected by means of bonding wires but rather by means of microstrip waveguides that are formed in the thin-film wiring layer and provide radio-frequency wave-guiding as far as the contact pad of the transmitting component or receiving component. This waveguide structure in particular largely prevents the radiofrequency driver signal, which has a comparatively high current, from effecting crosstalk with the low-current reception signal of the receiving component.

The arrangement of the components in at least one subassembly with a thin-film wiring layer especially enables a geometrically close arrangement of transmitting component and receiving component and thus a compact construction. The individual components in the subassembly can thus be arranged in greater proximity to one another on account of the low degree of cross-talk.

The solution according to the invention furthermore prevents an optical crosstalk since, on the one hand, the encapsulation composition in which the components are embedded prevents such crosstalk and, on the other hand, the transparent thin-film wiring layer does not permit transverse transmission of light on account of its small thickness. In this case, the encapsulation composition is preferably formed in nontransparent fashion.

The solution according to the invention thus provides a very small transceiver package that realizes a small optical axis distance of 750 μm, for example, provides radiofrequency wave-guiding (by means of microstrip waveguides) as far as the contact pad at the transmitting or receiving component and effectively prevents optical and electrical near-end crosstalk.

In this case, it is preferably provided that at least one electrically conductive layer connected to GROUND is additionally integrated into the wiring layer embodied using thin-film technology and extends at least in the region between the optical axes of transmitting component and receiving component. This GROUND layer is connected to a GROUND contact of the printed circuitboard via ball contacts, for example. Such a GROUND layer between the optical axes in the thin-film wiring layer suppresses electrical near-end crosstalk particularly reliably.

It is pointed out that the transceiver construction according to the invention—in particular also in the case of the preferred axis distance of 750 µm—is suitable in principle for coupling to any desired optical fibers. Coupling may be effected to plastic fibers or glass fibers. The plastic fibers may be for example 500 µm POF fibers or 1 mm POF fibers, the optical connector preferably integrating an adapter in the latter case. The glass fibers may be glass fibers having a core diameter of 50 µm, for example, it also being possible to provide a single-mode quality in the case of active alignment.

In one refinement, the transmitting component and the receiving component may emit and receive light having different wavelengths. It is equally possible for the received wavelength and the emitted wavelength to be identical. The transceiver preferably provides a bidirectional full duplex data traffic having an identical or different wavelength.

In a preferred development of the invention, the printed circuitboard is formed as a flexible sheet with a front side and a rear side. The front side of the flexible sheet forms the circuitry side with electrical conductor tracks. By contrast, the rear side of the flexible sheet is formed as a GROUND area apart from cutouts and plated-through holes. In this case, the rear side of the printed circuitboard that is embodied as a GROUND area points in the direction of the connector receptacle, i.e. the front side of the flexible sheet with the electrical and optoelectronic components points away from an optical connector to be coupled. These components are thus additionally protected against an electrical far-end crosstalk, i.e. electromagnetic interference (EMI), by the GROUND area. The GROUND area furthermore provides heat dissipation for the electrical and optoelectronic components.

Preferably, a planar, electrically conductive heat dissipating element, for instance a heat dissipating plate, is additionally provided, which is connected to GROUND potential. In this case, the heat dissipating element is arranged at a distance from the GROUND area of the flexible sheet, as a result of which an interspace arises between them. The transmitting component, the receiving component, the first circuitry module and the second circuitry module are arranged in said inter-space. This refinement provides particularly effective EMI shielding. The heat conducting element and the GROUND layer of the flexible conductor constitute a type of waveguide which lies below the cut-off frequency for the wavelengths that occur. In this way, the transceiver or the electrical and opto-electronic components thereof are effectively protected toward the outside against an electrical far-end crosstalk. In this case, the heat dissipating element simultaneously acts as a shielding plate.

In a further preferred refinement, the transceiver housing has an internal space in which a clamping part is arranged. The flexible conductor is clamped onto the clamping part in a bent arrangement. As a result of this, the flexible conductor can be arranged in a particularly space-saving manner in the transceiver.

The clamping part preferably has coupling structures for mechanical coupling and orientation of the transceiver with respect to an optical connector to be coupled. What are involved in this case are, by way of example, pin receptacles or guide pins which correspond with corresponding guide pins or pin receptacles of an MT-RJ connector. The coupling structures are embodied with very high precision on the clamping part since they determine the quality of the orientation of the optical connector with respect to the optoelectronic components. In this case, provision is preferably made for orienting the further components of the transceiver with respect to the coupling structures. A passive alignment of the transceiver components can thus be effected at the coupling structures that are embodied with high precision.

Insofar as the first and/or the second circuitry module has an external R, C circuitry, then the latter is likewise arranged compactly on the flexible conductor, namely the circuitry side of the flexible conductor. The use of an external R, C circuitry is known per se. It makes it possible to individualize circuitry modules such as a driver IC or a preamplifier IC for a specific application. The use of a flexible printed circuitboard makes it possible to realize an external R, C circuitry in a simple manner.

At one of its ends, the flexible conductor has SMD contacts via which it can come into electrical contact with assigned contacts of a main circuit carrier on which the transceiver is arranged. The main circuit carrier is a host printed circuitboard, for example. In this case, it may be provided that the transceiver housing has latching-in pins for passive orientation and fixing of the transceiver with respect to the main circuit carrier.

In a further advantageous refinement, an electrically conductive shielding body is arranged between the transmitting component and the receiving component, which shielding body is connected to GROUND potential and, for this purpose, is connected for example to a GROUND contact of the flexible conductor. The shielding body provides further shielding between the transmitting component and the receiving component and thereby additionally suppresses electrical near-end crosstalk. In this case, the shielding body may likewise be integrated into the encapsulation composition of the subassembly.

Furthermore, in addition to the heat dissipating element mentioned, a second electrically conductive heat dissipating element is preferably provided, which is connected to GROUND potential and is soldered to the GROUND area of the flexible conductor. This second heat conducting element dissipates heat that is output by the components of the subassembly to the GROUND area of the flexible conductor. In this respect, the further heat conducting element enables improved heat management.

Numerous arrangements of transmitting component, receiving component and the circuitry modules are possible. A first variant provides a single subassembly comprising the transmitting component, the first circuitry module, the receiving component and the second circuitry module. The transmitting component and the receiving component are situated in an adjacent arrangement between the circuitry modules. In this case, it may be provided that the subassembly has alignment openings for orientation with respect to coupling structures which serve for coupling to an optical connector.

A second variant provides two subassemblies, one subassembly comprising the transmitting component and the first circuitry module, the second subassembly comprising the receiving component and the second circuitry module, both subassemblies having a form that is square in section and being arranged in a manner oriented obliquely with respect to one another in order to realize a small distance between the transmitting component and the receiving component.

In a further preferred refinement, a microlens is incorporated into an underfill between the submodule and the printed circuitboard, said microlens performing beam shaping. The microlens may either be embodied as a separate part or be produced by laser ablation in the underfill material.

The transmitting component and the receiving component are preferably arranged at a distance from one another on the printed circuitboard which corresponds to the distance between the optical axes of an optical connector to be coupled, with the result that, in particular, a direct butt coupling to a "two fibers, 750 µm pitch" MT-RJ connector can be effected. Equally, in the case of single fibers, a direct butt coupling to a "one fiber pitch" MT-RJ connector can be effected, i.e. only one fiber is provided in the optical connector, into which both the light emitted by the transmitting component is coupled and the light to be detected by the receiving component is coupled out.

In this case, the shieldings described ensure an effective EMI shielding both externally and internally.

BRIEF DESCRIPTION OF THE DRAWINGS

The invention is explained in more detail below on the basis of a plurality of exemplary embodiments with reference to the figures, in which:

FIG. 6 shows a sectional illustration of an encapsulated IC package with thin-film wiring layer and ball contact layer;

DESCRIPTION OF A PLURALITY OF PREFERRED EXEMPLARY EMBODIMENTS

Figure 1:
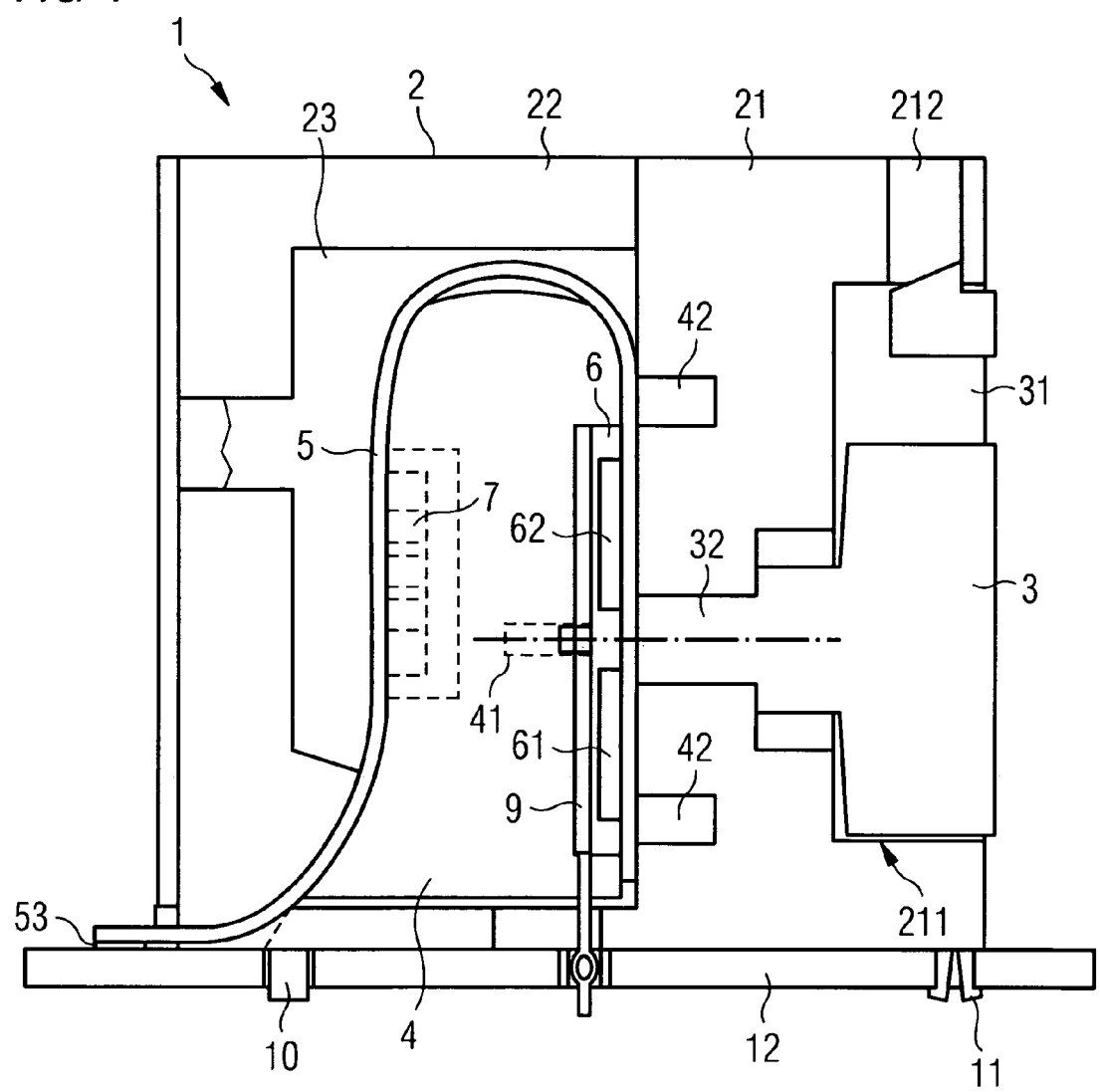
FIG. 1 shows the basic construction of a transceiver according to the invention in lateral sectional view.
Figure 7A:
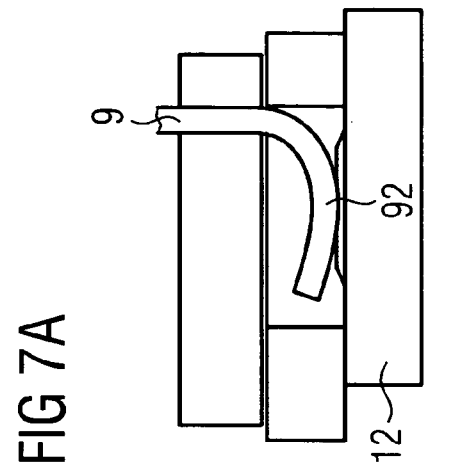
FIG. 7A shows a detail view of an SMD contact of a heat dissipating plate contained in the transceiver.
Figure 7:
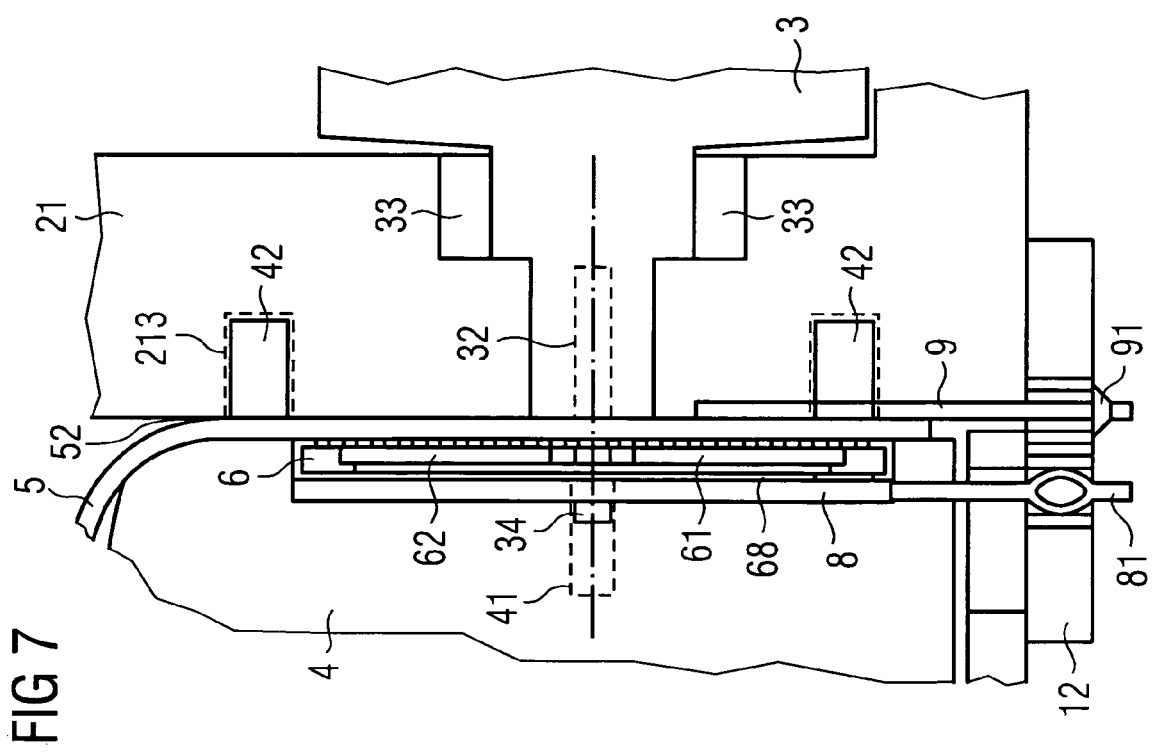
FIG. 7 shows a detail view of the transceiver of FIG. 1.

FIGS. 1 and 7 show the transceiver construction in principle. The transceiver 1 has a housing 2, a flexible printed circuitboard 5, a clamping part 4, onto which the printed circuitboard is wound, an IC package 6—arranged on the printed circuitboard 5—with a transmitting component, a receiving component and associated electrical modules, and also a heat dissipating plate 9. An optical MT-RJ connector 3 is plugged into the transceiver 1. The entire arrangement is situated on a main circuit carrier 12.

In the exemplary embodiment considered, the housing 2 is formed in two parts and comprises a front receptacle part 21 for receiving and coupling the optical connector 3 and also a rear housing part 22 having an internal space 23, in which the clamping part 4 with the printed circuitboard 5 is situated. In this case, after all the transceiver components have been fitted, the internal space 23 may be potted or packed with foamed material for the purpose of mechanical stability. This does not have to be effected completely, but rather may also be effected partially.

The front receptacle part 21, which is also referred to as a header, has a connector receptacle 211, into which the optical connector 3 is plugged. A latching opening 212 that is furthermore provided in the header 21 interacts with a latching mechanism 31 of the connector 3. The latching mechanism is an RJ-45 mechanism, by way of example.

The clamping part 4 on the one hand serves for mounting of the flexible printed circuitboard 5. Furthermore, it has a pin receptacle 41 embodied in high-precision fashion which serves for receiving a corresponding guide pin or alignment pin 34 of the optical connector 3. The MT-RJ connector 3 has two guide pins 34 embodied in high-precision fashion, so that two corresponding pin receptacles 41 are provided in the clamping part 4. As an alternative, the guide pins may be embodied on the clamping part 4 in a complementary manner, for which case the optical connector 3 then has pin receptacles. Such pin receptacles 32 in the connector 3 are indicated by broken lines in FIGS. 1 and 7.

The alignment of the IC package 6 and the printed circuit-board 5 is carried out with respect to the high-precision pin receptacles 41 (or guide pins alternatively present), which have a precision of ±3 µm according to standardization.

Figure 2B:
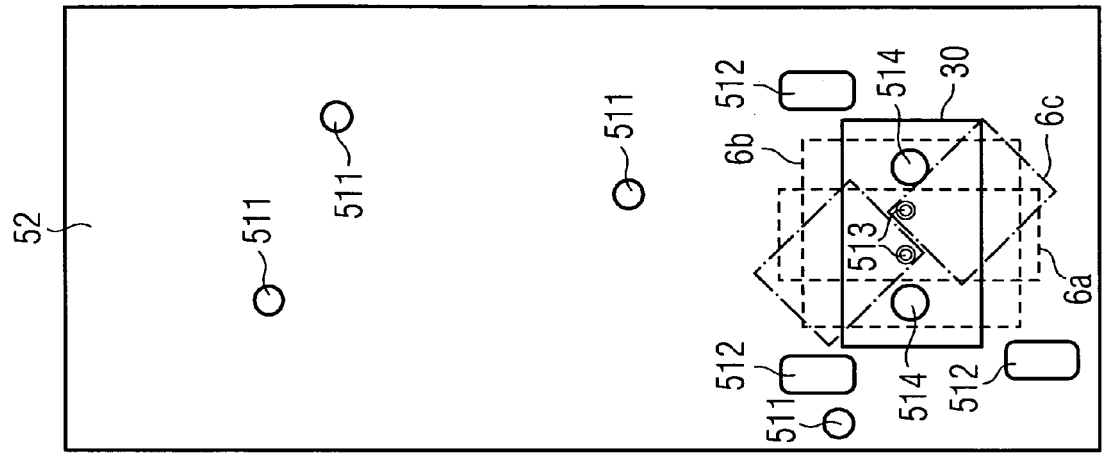
FIG. 2B shows the rear side of the flexible sheet of FIG. 2A, said rear side being formed as a GROUND area.
Figure 2A:
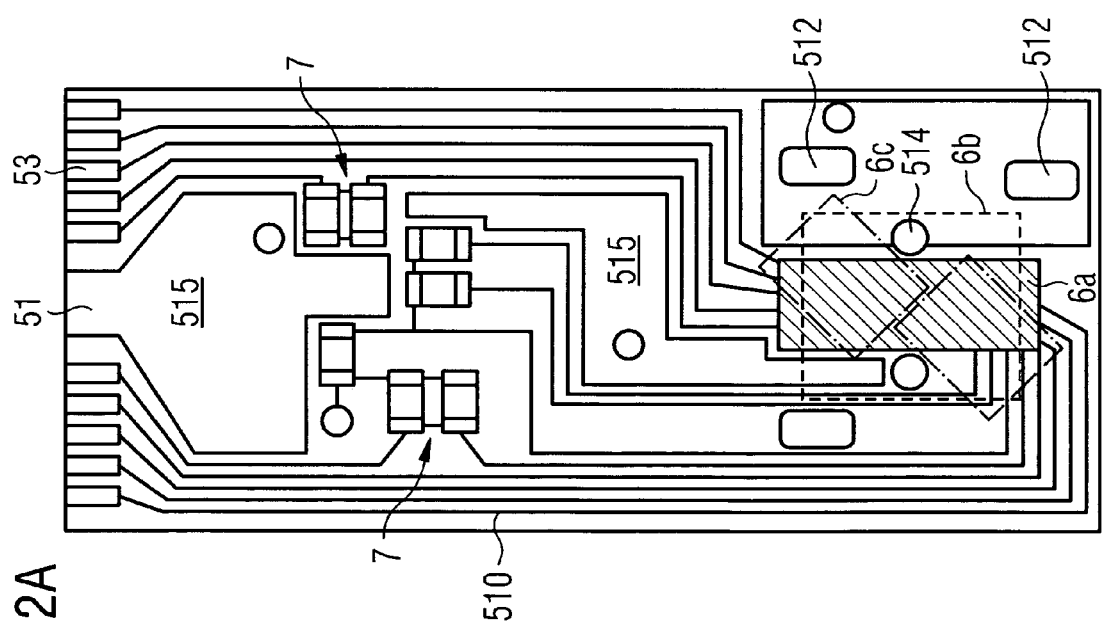
FIG. 2A shows, in plan view, the circuitry side of a flexible sheet as is used in the transceiver in accordance with FIG. 1.

The printed circuit-board 5 is formed as a flexible sheet, i.e. the conductor tracks are formed on an insulating, flexible substrate. As illustrated in FIGS. 2A, 2B, all the conductor tracks 510 are situated on one side 51 of the flexible sheet 5, which represents the circuitry side. By contrast, the rear side 52 is formed as a GROUND area throughout. By means of plated-through holes (GROUND vias), the GROUND potential is also provided at points on the circuitry side 51. The circuitry side 51 also has a few GROUND regions 515 in this case. Furthermore, there are also GROUND connections directly at the GROUND ball contacts of the IC package (not illustrated for reasons of clarity).

As is also illustrated in FIG. 1, the flexible sheet has a plurality of SMD contacts 53 at one of its ends. The clamping part 4 and the rear housing part 22 are formed such that the SMD contacts 53 at the end of the flexible sheet 5 are located horizontally on the main circuit carrier 12 and can be soldered to the latter. For a passive orientation of the SMD contacts 53, provision is made of latching-in pins 10 embodied at the bottom of the transceiver housing 2 in direct proximity to the SMD contacts.

The circuitry side 51 of the flexible sheet 5 serves as a circuit carrier on the one hand for the IC package 6 and on the other hand for an external R, C circuitry 7 of the IC package 6, comprising resistances and capacitances. In this case, the circuitry illustrated is to be understood merely by way of example.

The flexible sheet 5 furthermore has perforations 512, openings 513 and alignment holes 514 for the guide pins of the electrical connector 3.

The perforations 512 serve for fixing the flexible sheet 5 to the clamping part 4. For this purpose, the clamping part 4 has fixing structures in the form of projections 42 which project through the perforations 512 and into corresponding cutouts 213 in the header 21, also cf. FIG. 7. The fixing structures 42 thus serve on the one hand for fixing the flexible sheet 5 and on the other hand for fixing with respect to the header 21. In this case, the clamping part 4 is fixed by adhesive bonding in the corresponding cutouts 213 of the header 21. The cutouts 213 in the header 21 have a large tolerance, so that no forces are exerted on the alignment pins 34.

The openings 513 of the flexible sheet 5 are arranged in the region of the two optical axes and provide a light passage through the flexible sheet 5. The guide pins 34 of the connector 3 (or alternatively guide pins of the clamping part 4) pass through the alignment holes 514. In this case, FIG. 2B shows the projection of the inner plugging contour 30 of the MT-RJ connector 3 onto the flexible sheet 5.

FIGS. 2A and 2B furthermore show, using various broken lines, the contours of various IC package configurations 6a, 6b, 6c, which will be explained in more detail with reference to FIGS. 3A to 3C. The fixing structures 42 of the clamping part 4 lie outside the projection area 30 and the layouts of the IC packages 6a, 6b, 6c, so that the clamping part 4 can be embodied independently of the layout of the IC package 6a, 6b, 6c.

The precision of the perforations 512, openings 513 and alignment holes 514 is as follows. The perforations 512 for fixing to the clamping part 4 are embodied with high tolerance. The alignment holes 514 for the alignment pins 34 are embodied with very high precision, and the openings 513 in the region of the two optical axes are embodied with high precision.

In accordance with FIG. 1, the MT-RJ connector 3 is plugged into the connector receptacle 211 of the transceiver header 21 and latched to the latching-in device 31, 212. The GROUND area 52 of the flexible sheet 5, which GROUND area is closed apart from the perforations 512, openings 513 and alignment holes 514, forms the outer side and thus points toward the connector 3. By contrast, the circuitry of the flexible sheet 5 is embodied on the inner side 51.

Further details of the transceiver are illustrated in FIG. 7. Two heat dissipating plates 8 and 9 are present. The first heat dissipating plate 8 adjoins the clamping part 4. An interspace is formed between the first heat dissipating plate 8 and the flexible sheet 5, the IC package 6 being situated in said interspace. The second, optionally provided heat dissipating plate 9 is in thermally conductive contact with the GROUND layer 52 of the flexible sheet 5, in particular is soldered to the latter. The heat dissipating plates 8, 9 are connected to the main circuit carrier 12 by means of clamping, soldering or SMD contacts 81, 91, 92 (cf. FIG. 7A).

The transceiver construction described provides an effective shielding against external electromagnetic interference (EMI) and also good heat dissipation. The first heat dissipating plate 8, arranged on the rear side of the IC package 6, and the GROUND side 52 of the flexible sheet 5 form, with regard to the IC package 6, a planar waveguide arrangement having a very small thickness (preferably between 0.8 and 1 mm) into which electromagnetic fields in the frequency range considered cannot penetrate. This means, however, that the receiving element and the input pads of the receiver IC of the IC package 6 are shielded very well against external interference.

The first heat dissipating plate 8 at the same time also serves for heat dissipation, the contact to the main circuit carrier 12, as mentioned, being able to be formed as a clamping, soldering or SMD spring contact. Openings (not illustrated separately) are made in the heat dissipating plate 8 in the region of the alignment pins 34, so that contact with the alignment pins 34 of the optical connector 3 does not occur.

Heat dissipation is additionally effected via the ball contacts of the IC package 6 to the continuous GROUND copper coating 52 of the flexible sheet 5. It may optionally be improved by improving the thermal conduction of the encapsulation composition (molding composition) of the IC package 6 by means of additions. These may, by way of example, also be electrically conductive nanoparticles since all of the incorporated components have no electrical contacts to the encapsulation composition of the package 6. A further possibility for improving the heat dissipation consists in opening the IC package 6 as far as the IC rear sides by means of laser ablation, for example, and filling it again with thermally conductive material which forms a heat conducting layer 68 adjoining the first heat dissipating plate 8. Such a heat conducting layer is likewise illustrated in FIG. 7.

The second heat dissipating plate 9 is provided in order to improve the heat dissipation further. Said plate dissipates heat that is conducted via the ball contacts of the IC package 6 to the GROUND side 52 of the flexible sheet.

The connecting contacts 81, 91, 92 of the heat dissipating plates 8, 9 with the main circuit carrier 12 are preferably embodied in offset fashion in the case of both heat dissipating plates 8, 9. It is also possible for in each case more than one connecting contact to be provided.

The construction of the IC package 6 is explained below with reference to FIGS. 3 to 6. FIGS. 3A to 3C show three possible IC package layouts from the plan view of the circuitry side, which is connected to the circuitry side 51 of the flexible sheet 5. The redistribution layer and the ball contact layer are not illustrated in this case. These layers are illustrated separately in FIGS. 4 and 5.

Figure 3A:
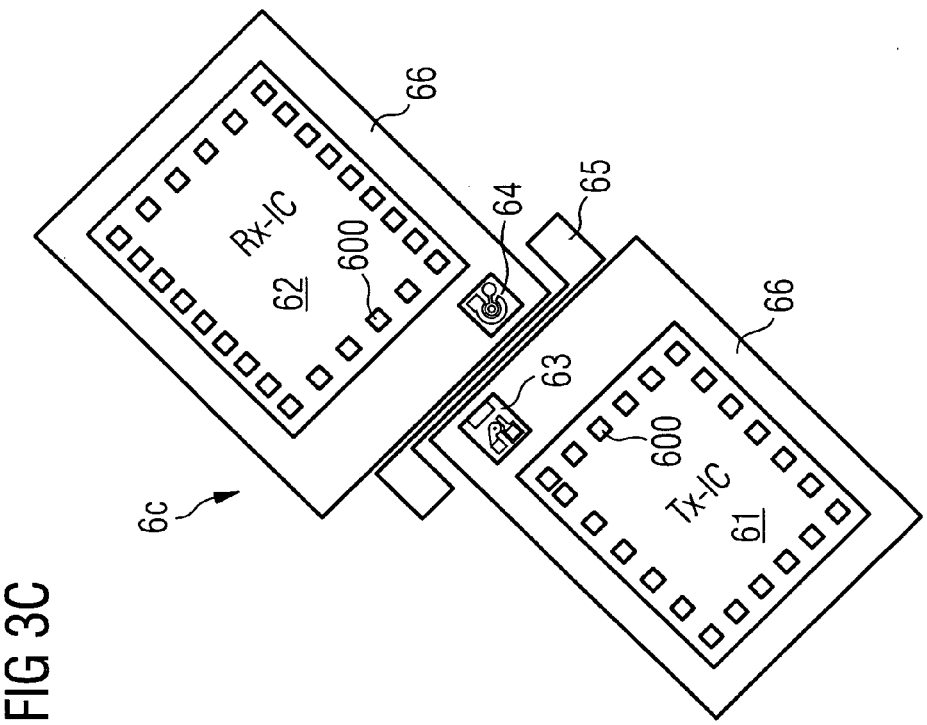
FIG. 3A shows a first layout of an IC package with a transmitting component, a receiving component and associated IC circuitry modules, which can be used in a transceiver in accordance with FIG. 1.

FIG. 3A shows a slim embodiment of the IC package 6a. FIG. 3B shows a wide embodiment of the IC package 6b with high-precision alignment holes 67. On account of the high-precision alignment holes 67, which are later aligned with the alignment holes 514 of the flexible sheet 5, the modules 61–64 may already be oriented to the flexible sheet 5 in high-precision fashion during soldering. The alignment holes are preferably realized by means of laser ablation. FIG. 3C shows a configuration with two separate subunits for the transmitter and the receiver which are arranged in a manner oriented obliquely with respect to one another.

The IC package 6a, 6b, 6c has, in all three configurations, as optoelectronic transducer components, a transmitting component (transmitting chip) 63, a receiving component (receiving chip) 64 and, as electrical modules, a driver IC 61 (Tx-IC) for the transmitting chip 63 and also a preamplifier IC 62 (Tx-IC) for the receiving chip 64. In this case, a postamplifier may also be integrated in the preamplifier IC 62. The transmitting component 63 is for example an LED or a semiconductor laser, in particular a vertically emitting laser (VCSEL). The receiving component 64 is a photodiode.

The components 61, 62, 63, 64 are embedded in a nontransparent encapsulation composition 66, the contacts 600 projecting upward out of the encapsulation composition 66. Moreover, light is coupled in from above in the case of the receiving chip 64 and light is coupled out from the transmitting chip 63 upward, in each case in relation to the plane of the drawing of FIGS. 3A to 3C.

Figure 3B:
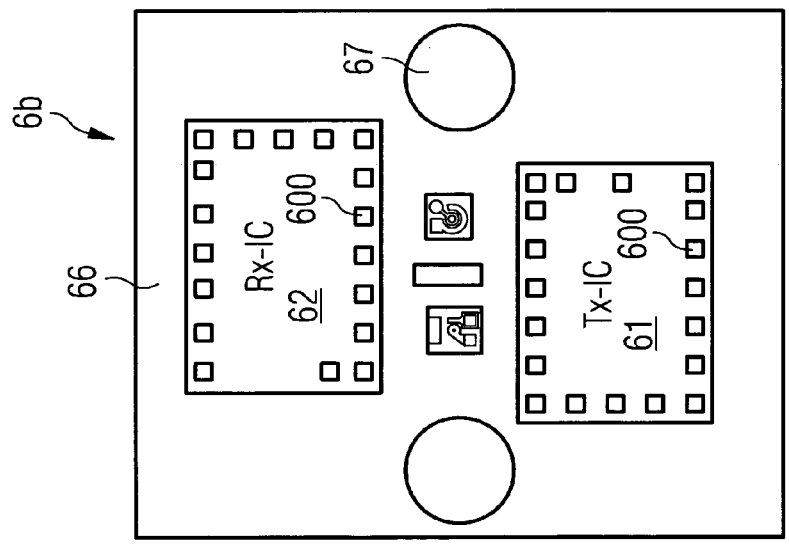
FIG. 3B shows a second layout of an IC package with a transmitting component, a receiving component and associated IC circuitry modules, which can be used in a transceiver in accordance with FIG. 1.
Figure 3C:
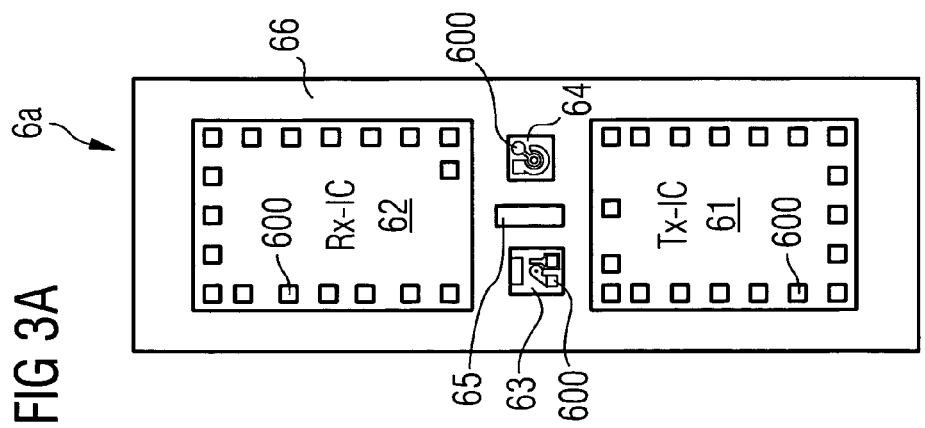
FIG. 3C shows a third layout of an IC package with a transmitting component, a receiving component and associated IC circuitry modules, which can be used in a transceiver in accordance with FIG. 1.

In the case of the configuration of FIG. 3C, the oblique orientation of the two subunits fulfills the requirement made of the coupling to the MT-RJ connector since the transmitting chip 63 and the receiving chip 64 can be arranged near to one another in this way.

In the case of the slim embodiment of FIG. 3A, the alignment pins lie outside the IC region. Both ICs 61, 62 are arranged with the narrower side toward the respective transducer 63, 64. Between the transmitting component 63 and the receiving component 64, it is optionally possible to mold in an electrically conducting shielding body 65 for suppressing the electrical crosstalk into the encapsulation composition 66. The same applies to the configuration of FIG. 3B. In the case of the configuration of FIG. 3C, the shielding body 65 is arranged in a small gap between the two subunits.

In order to produce the IC package 6a, 6b, 6c, the modules 61–64 are placed with the contacts 600 downward onto a support, for instance sheet. Encapsulation with the encapsulation composition 66 is subsequently effected. The latter initially fills the space as far as the sheet. The components 61–64 are then pressed against the sheet, the molding composition being pressed out. The sheet is then removed. In this case, the electrical contacts 600 are freed. A redistribution layer and a ball contact layer are then applied to the top side of the modules 61–64 and the contacts 600 by means of thin-film technology.

Within the transceiver 1, the IC package 6 constitutes one molded subassembly (FIGS. 3A, 3B) or two molded subassemblies (FIG. 3C).

Figure 4A:
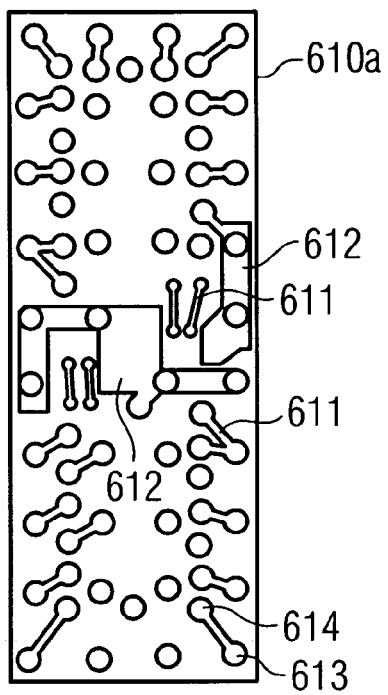
FIG. 4A shows a thin-film wiring layer of the IC package of FIG. 3A.
Figure 4B:
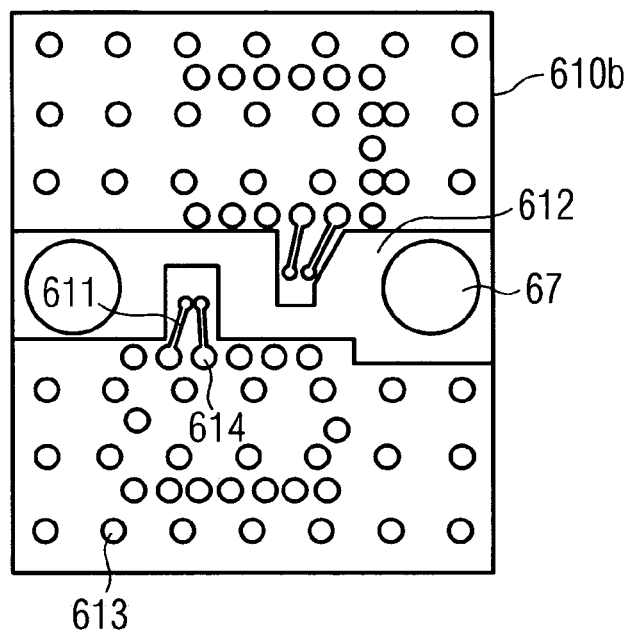
FIG. 4B shows the thin-film wiring layer of the IC package of FIG. 3B.

FIGS. 4A, 4B show the redistribution layers 610a, 610b associated with the IC packages 6a, 6b of FIGS. 3A, 3B. The redistribution layer of the IC package 6c of FIG. 3C is embodied in a corresponding manner. The respective pad contacts 600 of the transducers 63, 64 and ICs 61, 62 and also of the shielding bodies 65 (cf. FIGS. 3A, 3B) are connected up on the redistribution planes of the redistribution layer 610a, 610b or led to ball external contacts of the ball contact layer (cf. FIGS. 5A, 5B).

In this case, on the one hand, the redistribution layer 610a, 610b has contacts 614 to the pad contacts 600 of the modules 61–64. On the other hand, contacts 613 to the ball contacts of the ball contact layer are provided. The electrical lines within the redistribution layer are formed as microstrip lines 611. They connect the contacts of the driver IC 61 or of the preamplifier IC 62 to corresponding ball contacts in the ball contact layer or to corresponding contacts of the assigned transducers 63, 64.

In addition, in the redistribution layer 610a, 610b, an area 612 between and/or around the two transducer modules 63, 64 is embodied with a Cu layer that is connected to GROUND via a corresponding ball contact. Said area forms a GROUND shielding layer 612 within the redistribution layer 610a, 610b and serves for shielding between the transmitting chip 63 and the receiving chip 64, i.e. a near-end crosstalk between these components is prevented or reduced. The integration of the GROUND shielding layer 612 into the redistribution layer 610a, 610b represents a particularly compact and effecting shielding measure.

Figure 5A:
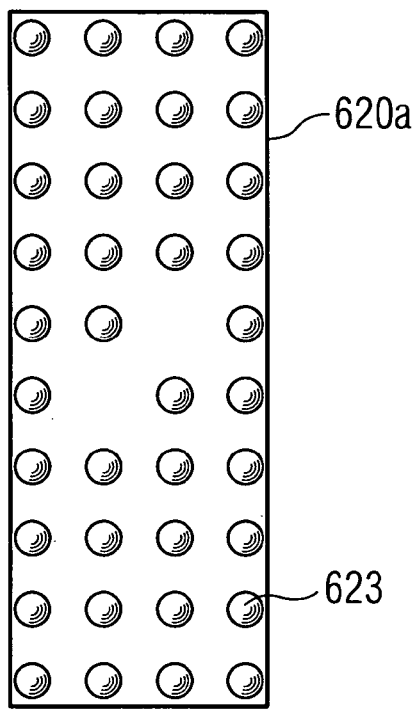
FIG. 5A shows the ball contact layer of the IC package of FIG. 3A.
Figure 5B:
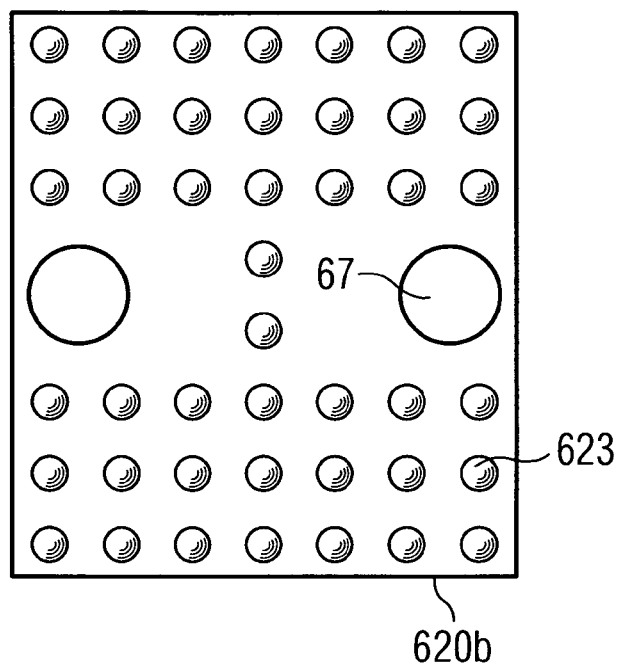
FIG. 5B shows the ball contact layer of the IC package of FIG. 5B.

FIGS. 5A, 5B respectively illustrate the ball contact layer 620a, 620b, which is embodied above the redistribution layer 610a, 610b. A plurality of ball contacts 623 are provided in a pitch of 0.5 mm, for example, said ball contacts serving for the electrical connection of the IC package 6 to corresponding contacts of the circuitry side 51 of the flexible sheet 5. At the same time, the ball contacts 623 serve for heat dissipation.

It is pointed out that the redistribution layer 610a, 610b and also the ball contact layer 620a, 620b need not have any cutouts in the region of the optical axes since they are optically transparent to the wavelengths used. However, no ball contacts 613, 623 are situated in the region of the optical axes.

FIG. 6 shows a section through an exemplary IC package with an electrical module 69, which is one of the modules 61–64, for example. The module 69 has pad contacts 600 and is arranged in a nontransparent encapsulation composition 66. The illustration shows the redistribution layer 610 and the ball contact layer 620 with ball contacts 623 which provide an electrical connection 611 between the pad contacts 600 and the ball contacts 623. The redistribution layer 610 has two redistribution planes in the example illustrated.

The electrical connections 611 are formed as micro-strip lines (with the GROUND layer 52 of the flexible board 5) that provide radiofrequency wave-guiding as far as the contact pads 600 of the transmitting component or receiving component 63, 64. This largely reduces electrical near-end crosstalk between the transmitting component 63 and the receiving component 64. The near-end crosstalk is additionally reduced, as explained, by additional GROUND shielding layers 612 in the redistribution layer 610 and also the shielding bodies 65 between transmitting component 63 and receiving component 64.

When mounting the IC package onto the flexible conductor 5, a lens 700, which is illustrated schematically and by broken lines in FIG. 6, may be integrated into the underfill between the package 6 and the flexible conductor 5 in the region of the ball contacts 623.

Figure 8:
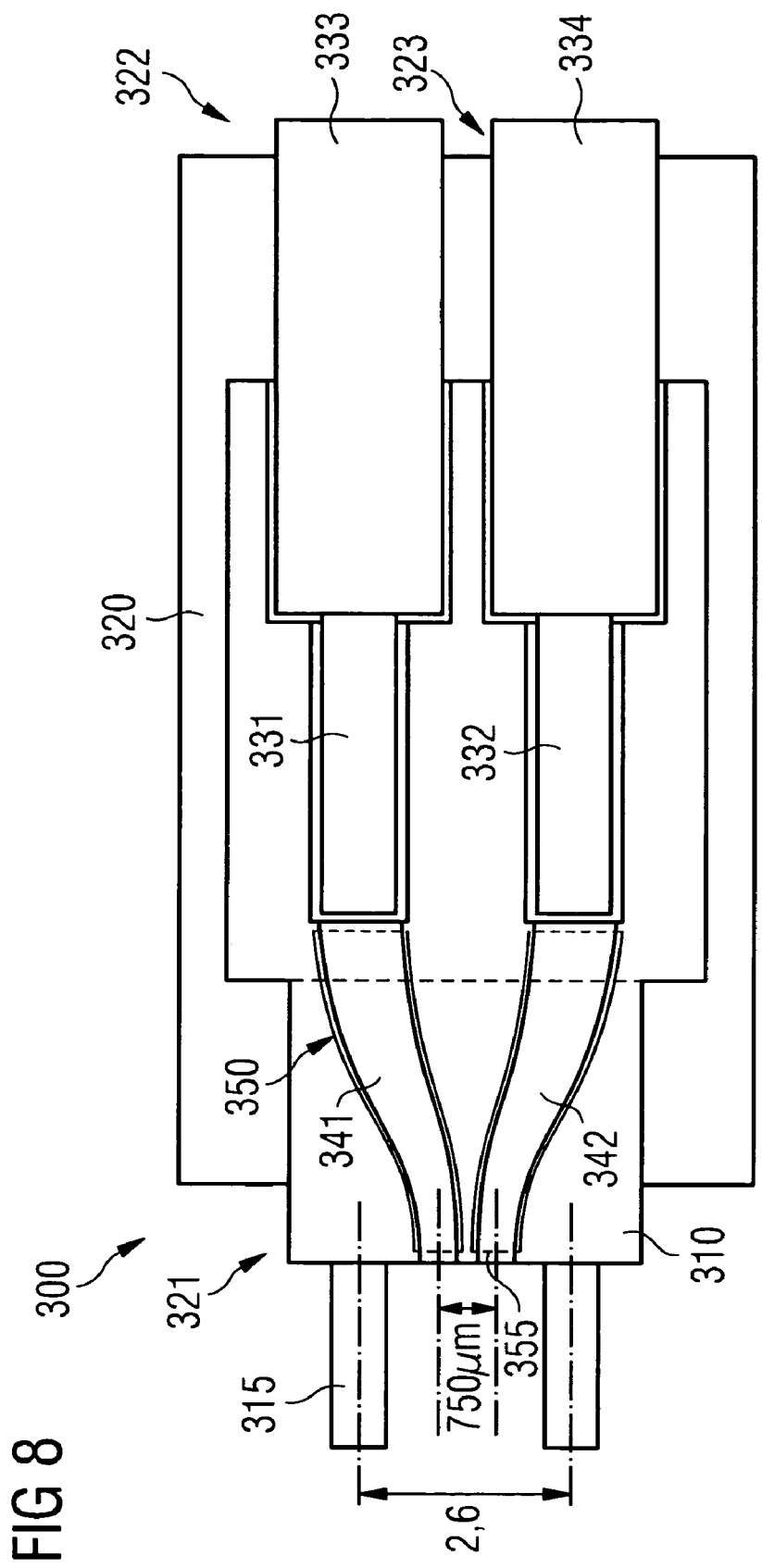
FIG. 8 shows an exemplary embodiment of an MT-RJ connector extension for coupling two 1 mm standard plastic fibers to a transceiver in accordance with FIG. 1.
Figure 9:
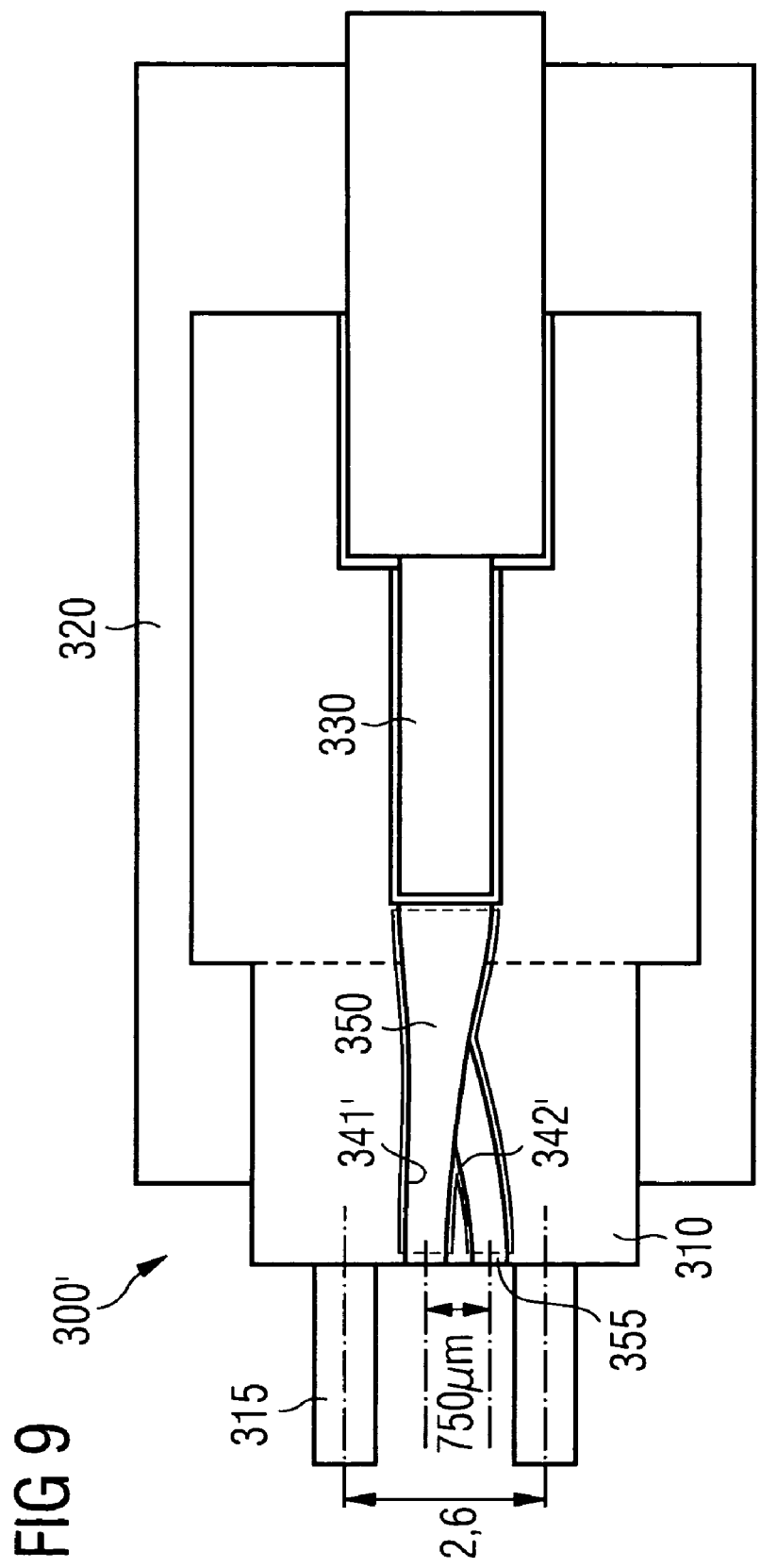
FIG. 9 shows an exemplary embodiment of an MT-RJ connector extension for coupling a 1 mm standard POF with bidirectional data traffic to a transceiver in accordance with FIG. 1.
Figure 10:
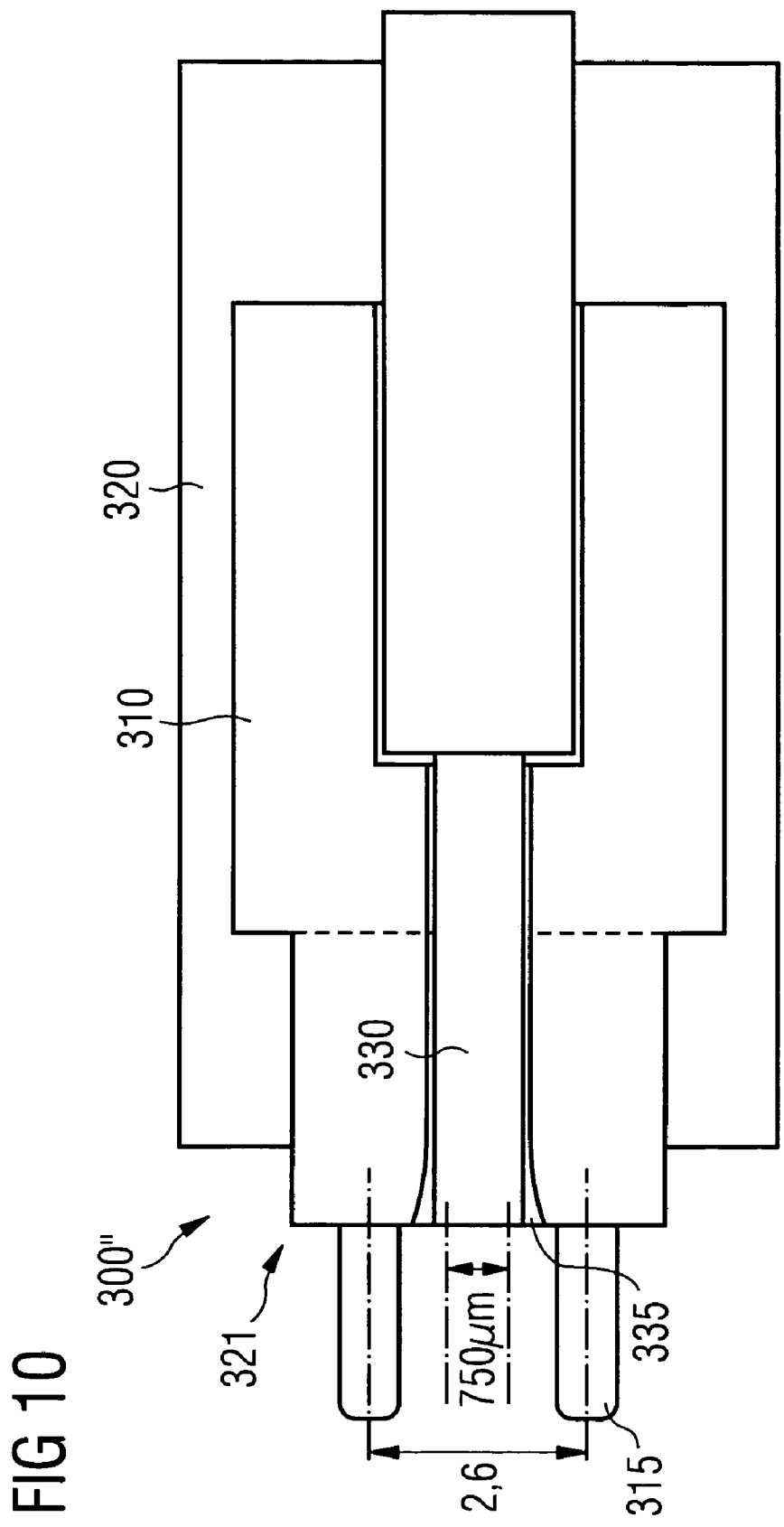
FIG. 10 shows an exemplary embodiment of an MT-RJ connector extension with an expanded 1 mm plastic fiber.

FIGS. 8 to 10 show a plurality of exemplary embodiments of extensions of MR-RJ connectors for coupling at least one optical fiber to an optoelectronic transceiver in accordance with FIG. 1, the diameter of the at least one optical fiber being greater than the distance between the optical axes of transmitting component and receiving component of the transceiver.

FIG. 8 shows an extension of an MT-RJ connector 300 with two guide pins or alignment pins 315, a coupling of two 1 mm standard plastic fibers (POF) 331, 332 being made possible. The following are provided in this case in a connector housing 320 with an MT-RJ external contour: a connector front side 321 and a connector rear side 322, at the connector rear side 322 two receptacle openings 323 for the plastic fibers 331, 332 provided with a cladding 333, 334, and two optical waveguide tapers 341, 342, which extend from the respective optical fiber 331, 332 as far as the connector front side 321 and end there at a distance from one another corresponding to the distance between the optical axes of transmitting component and receiving component of the transceiver 1. The tapers 341, 342 are arranged symmetrically with respect to one another and taper in the direction of the connector front side 321. The plastic fibers 331, 332 and the tapers 341, 342 are arranged in a connector insert 310 in the housing 320.

The tapers 341, 342 run in cutouts of the insert 310 and are surrounded by an air hose in this case, so that a high jump in refractive index is provided. Point-type taper supporting points 350 in the taper center, for example, prevent the tapers 341, 342 from being able to rest against the inner wall of the insert 310. The fact that the cladding of the taper 341, 342 is in each case formed by the air hose around the taper 341, 342 results in good guidance of the light beams in the taper 341, 342. The diameter of the air hose is dimensioned such that there is no optical coupling to the insert 310.

The insert 310 is embodied from optically nontransparent material in order that no optical crosstalk between the two tapers 341, 342 is possible. Near the connector front side 321, the tapers are held in a taper fixing ring 355 embodied in the insert 310.

Since the 750 µm distance between the two optical axes of the transceiver 1 means that a direct coupling of 1 mm plastic fibers is not possible, the latter are thus coupled via the waveguide tapers 341, 342. In this case, the waveguide tapers toward the connector front side 321 for example to 500 to 600 µm.

FIG. 9 shows an extension of an MT-RJ connector 300' for bidirectional data traffic via only one fiber 330, illustrated here by way of example for a 1 mm POF fiber. In this case, a taper 341' adjoining the only one waveguide 330 branches into two arms 341', 342'. A taper supporting point 350 and a taper fixing ring 355 are once again provided.

Since the two optical axes of the transceiver 1 have only a distance of 750 µm, the structural length of the taper coupler remains so short that there is space for it in the insert 310 of the MT-RJ connector 300. The two cross-sectional areas with respect to the transducer modules of the transceiver 1 are embodied in correspondingly adapted fashion in order that optimum coupling is provided. The insert 310 once again comprises a nontransparent material, with the result that optical crosstalk between the taper ends 341', 342' cannot take place.

An alternative configuration of an MT-RJ connector extension 300" for a 1 mm plastic fiber 330 is illustrated in FIG. 10. As in the case of FIGS. 8 and 9, too, provision is made of a connector housing 320 with an MT-RJ contour and an insert 310 made of a nontransparent material. The plastic fiber 330 is reshaped by means of hot embossing such that the waveguide 330 is expanded toward the connector front side 321 and forms an enlarged end side 335 in this case.

Figure 11:
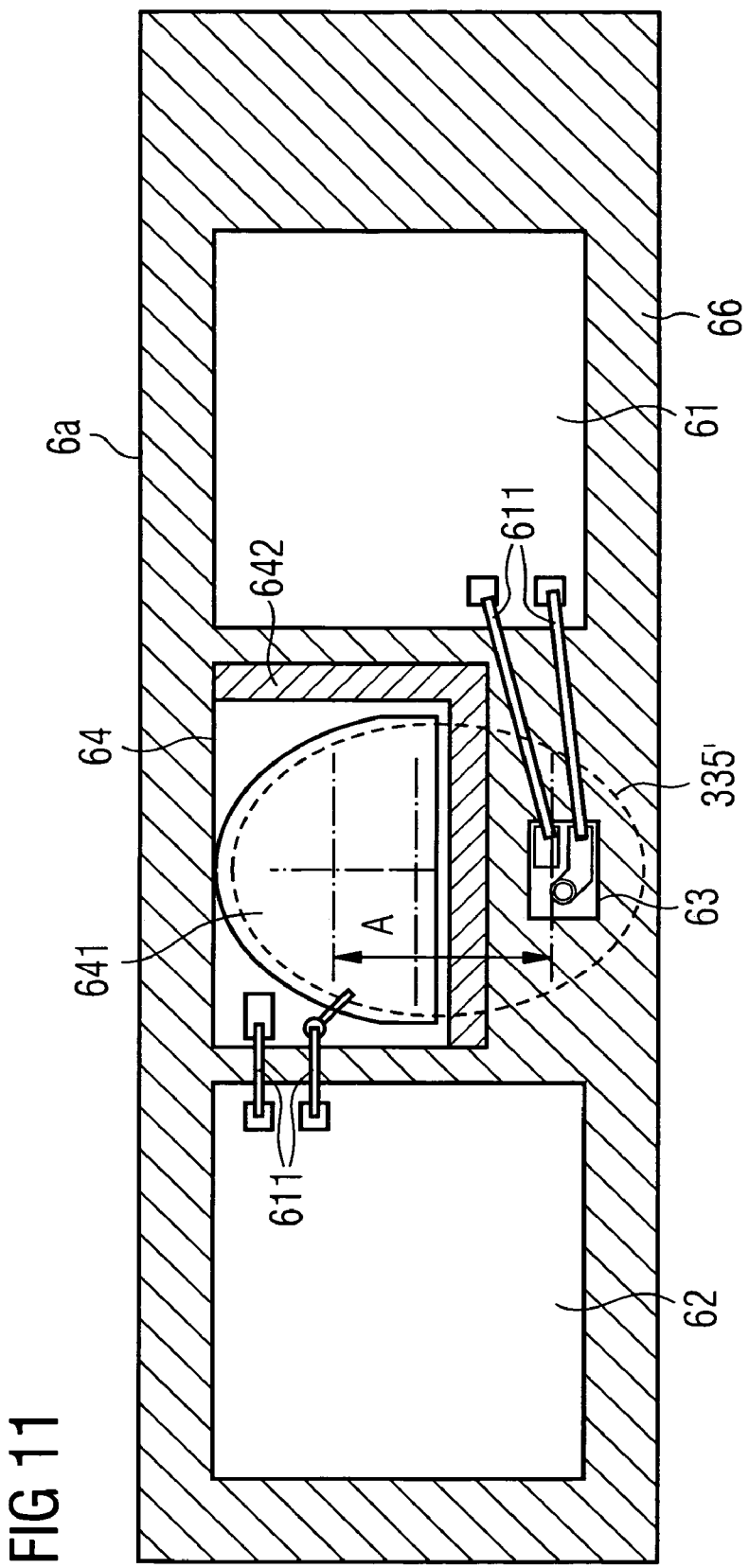
FIG. 11 shows a detail view of an IC package arranged in the transceiver of FIGS. 1 and 4 with partial illustration of electrical contacts and with illustration of the projection of a tapered plastic fiber in accordance with FIG. 10 onto the IC package.

FIG. 11 shows an IC package 6a in accordance with FIG. 3A, the interaction with an expanded plastic fiber of an MT-RJ connector extension 300" in accordance with FIG. 10 being illustrated. For the sake of clarity, the illustration does not show the thin-film layers (redistribution layer and ball contact layer) apart from the microstrip lines 611 to the transducers 63, 64. The projection of the tapered plastic fiber 330 with the enlarged end side 335 is indicated as broken line 335'.

The expansion of the plastic fiber end face permits the two optoelectronic transducers (transmitting component 63 and receiving component 64) to be constructed at a greater distance with respect to one another. The two horizontal dash-dotted lines indicate the 750 µm distance A in the case of the MT-RJ standard.

In the exemplary embodiment illustrated, the receiving component 64 is an Si photodiode and embodied with a size such that an optical reception power that is as high as possible is detected. In order to further suppress the electrical crosstalk from the transmitting component 63, an edge region of the photodiode 64 is embodied with an L-shaped metal layer 642, which is connected to GROUND via the redistribution layer and the ball contacts. Consequently, in the case of this configuration, in supplementation or as an alternative to the ground shielding layer 612 of the redistribution layer 610 (cf. FIGS. 4A, 4B), a shielding structure is formed at the receiving component 63 itself and connected to GROUND via the redistribution layer.

In the case of this configuration, the photodiode 64 and the transmitting component 63 share the cross-sectional area of the fiber end face (space diversity). The light that is to be detected and is coupled out from the plastic fiber 330 is thus also conducted to the transmitting component 64, but this is not disturbing for the latter.

If the transceiver construction illustrated in FIGS. 1 and 11 is coupled to an MT-RJ connector 300" in accordance with FIG. 10, this enables a bidirectional full duplex data traffic at identical wavelength for the receiving and transmitting paths without a front reflection falling onto the photodiode 64 (optical near-end crosstalk). Only transmission power scattered in the backward direction and light reflected from the fiber end (optical far-end crosstalk) fall onto the photodiode.

The configuration of the invention is not restricted to the exemplary embodiments illustrated above. The person skilled in the art recognizes that numerous alternative embodiment variants exist which, despite their deviation from the exemplary embodiments described, make use of the teaching defined in the subsequent claims.

I claim:

1. An optoelectronic transceiver having:
   a transmitting component, which converts electrical signals into optical signals,
   a first circuitry module for the transmitting component,
   a receiving component, which converts optical signals into electrical signals,
   a second circuitry module for the receiving component,
   a printed circuit board with conductor tracks, on which the transmitting component, the receiving component, the first circuitry module and the second circuitry module are each directly arranged, and
   a transceiver housing, which comprises a non-conductive material and has a connector receptacle for receiving and coupling an optical connector,
   wherein the transmitting component, the first circuitry module, the receiving component and the second circuitry module form at least one subassembly, the subassembly having:
   an encapsulation composition, in which the components of the subassembly are embedded, and
   a wiring layer embodied using thin-film technology and comprising microstrip waveguides, said wiring layer providing an electrical contact connection on the one hand between the components of the subassembly among one another and on the other hand to associated contacts of the printed circuit board.

2. The transceiver as claimed in claim 1, wherein at least one layer connected to GROUND additionally being integrated into the wiring layer and extending at least in the region between optical axes of the transmitting component and receiving component.

3. The transceiver as claimed in claim 1,
   wherein the printed circuit board
   is formed as a flexible sheet with a front side and a rear side,
   the front side of the flexible sheet forming the circuitry side with electrical conductor tracks, the rear side of the flexible sheet being formed as a GROUND area apart from cutouts and plated-through holes, and the rear side of the printed circuit board that is embodied as a GROUND area pointing in the direction of the connector receptacle.

4. The transceiver as claimed in claim 3, further comprising a planar, electrically conductive heat dissipating element, which is connected to GROUND potential, wherein the heat dissipating element is arranged at a distance from the GROUND area of the flexible sheet, as a result of which there is an interspace between them, and wherein the transmitting component, the receiving component, the first circuitry module and the second circuitry module are arranged in the interspace.

5. The transceiver as claimed in claim 3, wherein the transceiver housing defines an internal space in which a clamping part is arranged, and the flexible conductor being clamped onto the clamping part in a bent arrangement.

6. The transceiver as claimed in claim 5, the clamping part having coupling structures for mechanical coupling and orientation of the transceiver with respect to an optical connector to be coupled.

7. The transceiver as claimed in claim 5, the components of the transceiver being oriented with respect to the coupling structures.

8. The transceiver as claimed in claim 3, wherein at least one of the first and second circuitry modules comprises an external R, C circuitry that is arranged on the flexible conductor.

9. The transceiver as claimed in claim 3, wherein the flexible conductor further comprises, at one of its ends, SMD contacts via which it can come into electrical contact with assigned contacts of a main circuit carrier.

10. The transceiver as claimed in claim 9, the transceiver housing having latching-in pins for passive orientation and fixing of the transceiver with respect to a main circuit carrier.

11. The transceiver as claimed in claim 1, wherein the wiring layer further comprises a redistribution layer and a ball contact layer, the redistribution layer having electrical lines comprising microstrip lines, and the ball contact layer having ball contacts, wherein the electrical lines electrically connect the components of the subassembly to the corresponding ball contacts.

12. The transceiver as claimed in claim 11, wherein the redistribution layer comprises at least one shielding layer connected to GROUND and extending at least in the region between optical axes of the transmitting component and receiving component.

13. The transceiver as claimed in claim 1, further comprising a microlens integrated into an underfill between the subassembly and the printed circuit board.

14. The transceiver as claimed in claim 1, wherein the at least one subassembly has alignment openings for orientation with respect to coupling structures which serve for coupling to an optical connector.

15. The transceiver as claimed in claim 1,
comprising first and second subassemblies,
the first subassembly comprising the transmitting component and the first circuitry module,
the second subassembly comprising the receiving component and the second circuitry module,
both the first and second subassemblies having a form that is square in section and
both the first and second subassemblies being arranged in a manner oriented obliquely with respect to one another in order to realize a small distance between the transmitting component and the receiving component.

16. The transceiver as claimed in claim 1, the optical axes of transmitting component and receiving component having a distance of 750 μm.

17. The transceiver as claimed in claim 1, wherein the first circuitry module comprises a driver IC.

18. The transceiver as claimed in claim 1, wherein the second circuitry module comprises one of a preamplifier IC and a pre- and postamplifier IC.

19. An optoelectronic transceiver having:
a transmitting component, which converts electrical signals into optical signals,
a first circuitry module for the transmitting component,
a receiving component, which converts optical signals into electrical signals, wherein the receiving component and/or the transmitting component comprise an electrically shielding structure connected to GROUND via a wiring layer,
a second circuitry module for the receiving component,
a printed circuit board with conductor tracks, on which the transmitting component, the receiving component, the first circuitry module and the second circuitry module are arranged, and
a transceiver housing, which comprises a non-conductive material and has a connector receptacle for receiving and coupling an optical connector,
wherein the transmitting component, the first circuitry module, the receiving component and the second circuitry module form at lease one subassembly, the subassembly having:
an encapsulation composition, in which the components of the subassembly are embedded, and
the wiring layer embodied using thin-film technology, said wiring layer providing an electrical contact connection on the one hand between the components of the subassembly among one another and on the other hand to associated contacts of the printed circuit board.

20. The transceiver as claimed in claim 19, the shielding structure being formed in L-shaped fashion.

21. An optoelectronic transceiver having:
a transmitting component, which converts electrical signals into optical signals,
a first circuitry module for the transmitting component,
a receiving component, which converts optical signals into electrical signals,
an electrically conductive shielding body, which is arranged between the transmitting component and the receiving component and is connected to GROUND potential,
a second circuitry module for the receiving component,
a printed circuit board with conductor tracks, on which the transmitting component, the receiving component, the first circuitry module and the second circuitry module are arranged, and
a transceiver housing, which comprises a non-conductive material and has a connector receptacle for receiving and coupling an optical connector,
wherein the transmitting component, the first circuitry module, the receiving component and the second circuitry module form at lease one subassembly, the subassembly having:
an encapsulation composition, in which the components of the subassembly are embedded, and
a wiring layer embodied using thin-film technology, said wiring layer providing an electrical contact connection on the one hand between the components of the subassembly among one another and on the other hand to associated contacts of the printed circuit board.

22. An optoelectronic transceiver comprising:
a transceiver housing defining an internal space, the transceiver housing including a header having a connector receptacle including first and second pin openings for receiving pins from a connector;
a flexible printed circuit board having a first portion located outside of the transceiver housing and a second portion located inside the internal space and positioned over the first and second pin openings; and
at least one subassembly mounted onto the second portion of the printed circuit board, said at least one subassembly including:
a transmitting component mounted adjacent to the first pin opening for converting first electrical signals into optical signals,
a first circuitry module for transmitting the first electrical signals to the transmitting component,
a receiving component mounted adjacent to the second pin opening for converting optical signals into second electrical signals,
a second circuitry module for receiving the second electrical signals from the receiving component,
wherein said at least one subassembly includes:
a package cover encasing associated components of the transmitting component, the first circuitry module, the receiving component and the second circuitry module, and
a thin-film wiring layer comprising microstrip waveguides, the thin-film wiring layer being connected to the package housing for providing an electrical connection between the associated components of said each subassembly and associated contacts provided on the second portion of the flexible printed circuit board.

23. The transceiver as claimed in claim 22, wherein the wiring layer further comprises a redistribution layer and a ball contact layer, the redistribution layer having electrical lines comprising microstrip lines, and the ball contact layer having ball contacts, wherein the electrical lines electrically connect the components of the subassembly to the corresponding ball contacts.

24. The transceiver as claimed in claim 23, wherein the redistribution layer comprises at least one shielding layer connected to GROUND and extending at least in the region between optical axes of the transmitting component and receiving component.

25. An optoelectronic transceiver having:
a transmitting component, which converts electrical signals into optical signals,
a first circuitry module for the transmitting component,
a receiving component, which converts optical signals into electrical signals,
a second circuitry module for the receiving component,
a printed circuit board with conductor tracks, on which the transmitting component, the receiving component, the first circuitry module and the second circuitry module are arranged, wherein the printed circuit board is formed as a flexible sheet with a front side and a rear side, the front side of the flexible sheet forming the circuitry side with electrical conductor tracks, the rear side of the flexible sheet being formed as a GROUND area apart from cutouts and plated-through holes,
a transceiver housing, which comprises a non-conductive material and has a connector receptacle for receiving and coupling an optical connector, the rear side of the printed circuit board that is embodied as a GROUND area pointing in the direction of the connector receptacle,
wherein the transmitting component, the first circuitry module, the receiving component and the second circuitry module form at least one subassembly, the subassembly having:
an encapsulation composition, in which the components of the subassembly are embedded, and
a wiring layer embodied using thin-film technology, said wiring layer providing an electrical contact connection on the one hand between the components of the subassembly among one another and on the other hand to associated contacts of the printed circuit board, and
a planar, electrically conductive heat dissipating element which is connected to GROUND potential, wherein the heat dissipating element is arranged at a distance from the GROUND area of the flexible sheet, as a result of which there is an interspace between them, and wherein the transmitting component, the receiving component, the first circuitry module and the second circuitry module are arranged in the interspace.

26. The transceiver as claimed in claim 25, further comprising a second electrically conductive heat dissipating element, which is connected to GROUND potential, the second heat dissipating element being soldered to the GROUND area of the flexible conductor.

* * * * *